United States Patent
Igarashi et al.

(10) Patent No.: US 7,511,557 B2
(45) Date of Patent: Mar. 31, 2009

(54) QUADRATURE MIXER CIRCUIT AND RF COMMUNICATION SEMICONDUCTOR INTEGRATED CIRCUIT

(75) Inventors: Yutaka Igarashi, Yokohama (JP); Akio Yamamoto, Hiratsuka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/581,776

(22) Filed: Oct. 17, 2006

(65) Prior Publication Data

US 2007/0146044 A1 Jun. 28, 2007

(30) Foreign Application Priority Data

Dec. 27, 2005 (JP) ............................. 2005-373725

(51) Int. Cl.
*G06G 7/44* (2006.01)
(52) U.S. Cl. ................... 327/357; 327/358; 327/359; 455/333
(58) Field of Classification Search ................. 327/357, 327/358, 359; 455/333
See application file for complete search history.

(56) References Cited

U.S. PATENT DOCUMENTS 6,226,509 B1 * 5/2001 Mole et al. ................... 455/302
6,871,057 B2 * 3/2005 Ugajin et al. ................ 455/323
7,027,792 B1 * 4/2006 Luff et al. .................... 455/314

FOREIGN PATENT DOCUMENTS

JP 2004-180281 6/2004

OTHER PUBLICATIONS

"The Design of CMOS Radio-Frequency Integrated Circuits" by Thomas H. Lee, Cambridge (Non-Patent Document 1), Jan. 13, 1998.
"Direct Conversion Receivers in Wide-Band Systems" by Aarno Parssinen, Kluwer Academic Publishers (Non-Patent Document 2), Dec. 1, 2001.

* cited by examiner

*Primary Examiner*—Kenneth B. Wells
(74) *Attorney, Agent, or Firm*—McDermott Will & Emery LLP

(57) ABSTRACT

A quadrature mixer circuit and an RF communication semiconductor integrated circuit capable of suppressing variations in secondary distortion while reducing the current consumption are provided. In a quadrature mixer circuit, even if local signals different by 90 degrees inputted to the bases of I transistors and Q transistors have large amplitudes, interference is suppressed by I resistors, Q resistors, and capacitors. Also, since the capacitors are provided, changes in bias current values can be suppressed. Accordingly, variations in secondary distortion can be suppressed. Furthermore, the capacitors combine current outputs of a differential circuit formed of I transistors and the resistor and a differential circuit formed of Q transistors and the resistor. Therefore, current consumption can also be reduced.

1 Claim, 3 Drawing Sheets

QUADRATURE MIXER CIRCUIT AND RF COMMUNICATION SEMICONDUCTOR INTEGRATED CIRCUIT

CROSS-REFERENCE TO RELATED APPLICATION

The present application claims priority from Japanese patent application No. JP2005-373725 filed on Dec. 27, 2005, the content of which is hereby incorporated by reference into this application.

TECHNICAL FIELD OF THE INVENTION

The present invention relates to mixer circuits. More particularly, it relates to a quadrature mixer circuit and RF communication semiconductor integrated circuit in which the signals are frequency-converted by using two local signals that are equal in frequency and different in phase by 90 degrees.

BACKGROUND OF THE INVENTION

In a conventional wireless signal processing circuit, discrete components are used for respective functional blocks (such as an amplifier for signal amplification, a mixer for signal frequency conversion, a filter for passing only a signal of a desired bandwidth). However, with the recent improvements in semiconductor technology, a plurality of functional blocks configuring a wireless signal processing circuit have been able to be incorporated in one semiconductor chip. A wireless signal processing circuit with its components incorporated in one or more semiconductor chips converts a radio-frequency signal received from an antenna to a signal of a lower frequency band with high quality (with less noise or suppressing signals in bands other than a desired band).

To achieve a wireless signal processing circuit at low cost, more functional blocks configuring the wireless signal processing circuit have to be incorporated in one semiconductor chip. One of the problems to be solved to achieve this object is that a filter circuit that suppresses signals in bands other than a desired band cannot be incorporated in a semiconductor chip. In general, an SAW (Surface Acoustic Wave) filter, a dielectric filter, or the like is used as the filter circuit. The signals in bands other than a desired band are suppressed by using such a filter. However, such an SAW filter or dielectric filter cannot be incorporated in a semiconductor chip.

In general, the wireless signal processing circuit formed of discrete components is formed in a configuration called superheterodyne method, which requires an SAW filter or dielectric filter (regarding superheterodyne, refer to, for example, "The Design of CMOS Radio-Frequency Integrated Circuits" by Thomas H. Lee, CAMBRIDGE (Non-Patent Document 1)). However, such an SAW filter or dielectric filter cannot be incorporated in a semiconductor chip. Therefore, if a wireless signal processing circuit fabricated through a semiconductor process is configured according to the superheterodyne method, an SAW filter or dielectric filter has to be externally provided outside a semiconductor chip. This increases the number of components and implementation area.

To get around this problem, a scheme for a wireless signal processing circuit without requiring an SAW filter or dielectric filter by using an advantage of a semiconductor circuit (although the absolute values of component constants are varied among semiconductor chips, relative values of the component constants in one semiconductor chip coincide with one another with high accuracy) has been proposed. This scheme includes a zero-IF scheme, a low-IF scheme, or a wideband IF scheme. In any of these schemes, an external SAW filter or dielectric filter is not required, and signals in bands other than the desired band are suppressed by a filter that can be incorporated in a semiconductor (there may be a case where part of the filter may have to be externally provided depending on a wireless scheme or due to a system requirement).

Basic principles of the zero-IF scheme, the low-IF scheme, the wideband IF scheme, and others are described in, for example, "DIRECT CONVERSION RECEIVERS IN WIDE-BAND SYSTEMS" by Aarno Parssinen, Kluwer Academic Publishers (Non-Patent Document 2). In the zero-IF scheme, the low-IF scheme, and the wideband IF scheme, there is a common characteristic in the configuration of a mixer circuit for signal frequency conversion. This mixer is referred to as a quadrature mixer, and its general circuit diagram is shown in FIG. 2.

In the quadrature mixer circuit of FIG. 2, 10 denotes a local signal oscillator; 20 denotes a 90-degree phase-shift circuit; 30 to 50 denote bias circuits; VCC denotes a battery; C3 and C4 denote capacitors; R1, R2, RI1, RI2, RI5 to RI7, RQ1, RQ2, RQ5 to RQ7 denote resistors; QI1 to QI6 and QQ1 to QQ6 denote transistors; IEI1, IEI2, IEQ1, and IEQ2 denote current sources; RFin1 and RFin2 denote input terminals; Iout1 and Iout2 denote I output terminals; and Qout1 and Qout2 denote Q output terminals.

In FIG. 2, the current of the current source IEI1=the current of the current source IEI2=the current of the current source IEQ1=the current of the current source IEQ2;

the transistors QI1, QI2, QQ1, and QQ2 are equal to one another in size, shape, and characteristic;

the transistors QI3 to QI6 and QQ3 to QQ6 are equal to one another in size, shape, and characteristic;

the resistance value of RI1=the resistance value of RI2=the resistance value of RQ1=the resistance value of RQ2=RL;

the resistance value of RI6=the resistance value of RI7=the resistance value of RQ6=the resistance value of RQ7;

the resistance value of RI5=the resistance value of RQ5=RE;

the resistance value of R1=the resistance value of R2; and the capacitance value of C3=the capacitance value of C4.

It is assumed that the bias circuits 30 to 50 provide a direct-current (DC) bias voltage to the transistors QI1 to QI6 and QQ1 to QQ6 of FIG. 2 so that the transistors QI1 to QI6 and QQ1 to QQ6 operate appropriately. That is, it is assumed that:

the base voltage of the transistor QI1=the base voltage of the transistor QI2=the base voltage of the transistor QQ1=the base voltage of the transistor QQ2;

the base voltage of the transistor QI3=the base voltage of the transistor QI4=the base voltage of the transistor QI5=the base voltage of the transistor QI6=the base voltage of the transistor QQ3=the base voltage of the transistor QQ4=the base voltage of the transistor QQ5=the base voltage of the transistor QQ6;

the base voltage of the transistor QI1>the emitter voltage of the transistor QI1;

the collector voltage of the transistor QI1>the emitter voltage of the transistor QI1;

the base voltage of the transistor QI2>the emitter voltage of the transistor QI2;

the collector voltage of the transistor QI2>the emitter voltage of the transistor QI2;

the collector voltages of the transistors QI3 and QI5>the emitter voltages of the transistors QI3 and QI5;

the collector voltages of the transistors QI4 and QI6>the emitter voltages of the transistors QI4 and QI6;

the base voltage of the transistor QQ1>the emitter voltage of the transistor QQ1;

the collector voltage of the transistors QQ1>the emitter voltage of the transistor QQ1;

the base voltage of the transistor QQ2>the emitter voltage of the transistors QQ2;

the collector voltage of the transistor QQ2>the emitter voltage of the transistor QQ2;

the collector voltages of the transistors QQ3 and QQ5>the emitter voltages of the transistors QQ3 and QQ5; and the collector voltages of the transistors QQ4 and QQ6>the emitter voltages of the transistors QQ4 and QQ6.

Direct-current components of an RF signal inputted as a differential signal from the input terminal RFin1 are cut by the capacitor C3, and the RF signal is then branched and inputted to the bases of the transistors QI2 and QQ2. Also, direct-current components of an RF signal inputted as a differential signal from the input terminal RFin2 are cut by the capacitor C4, and the RF signal is then branched and inputted to the bases of the transistors QI1 and QQ1. The current sources IEI1 and IEI2 supply a bias current to the transistors QI1 and QI2, respectively, and the current sources IEQ1 and IEQ2 supply a bias current to the transistors QQ1 and QQ2, respectively.

The RF signal voltages inputted as differential signals from the input terminals RFin1 and RFin2 are converted to the RF signal currents through the voltage-current conversion by the transistors QI1, QI2, QQ1 and QQ2 and the resistors RI5 and RQ5.

When an RF signal voltage (alternating-current component) inputted as a differential signal from the input terminals RFin1 and RFin2 is taken as vRF and an RF signal current after voltage-current conversion (alternating-current component) is taken as iRF, iRF
=the RF signal current of the collector current of the transistor QI1 (alternating-current component)-the RF signal current of the collector current of the transistor QI2 (alternating-current component)
=the RF signal current of the collector current of the transistor QQ1 (alternating-current component)-the RF signal current of the collector current of the transistor QQ2 (alternating-current component)
=vRF/RE Local signals outputted from the local signal oscillator 10 are inputted to the bases of the transistors QI3 to QI6. Therefore, the transistors QI3 to QI6 operate as switching circuits that switch a current with the same phase as that of the local signal oscillator 10. In this case, the current to be switched is iRF described above. By switching iRF with the same phase as that of the local signal, a difference component between the collector voltage of the transistor QI3 or QI5 and the collector voltage of the transistor QI4 or QI6 (VIout1-VIout2 when a voltage of the output terminal Iout1 is taken as VIout1 and a voltage of the output terminal Iout2 is taken as VIout2) includes frequency components indicative of difference and sum of the signal frequency components of iRF and the signal frequency of the local signal oscillator 10.

The local signal is a differential signal. That is, the local signal inputted to the base of the transistor QI3 or QI5 is different in phase by 180 degrees from the local signal inputted to the base of the transistor QI4 or QI6. When the amplitude voltage of the local signal inputted to the base of the transistor QI3 or QI5 is larger than the amplitude voltage of the local signal inputted to the base of the transistor QI4 or QI6, the state between the base and the collector of the transistor QI3 or QI5 is in an ON state, and the state between the base and the collector of the transistor QI4 or QI6 is in an OFF state. When the amplitude voltage of the local signal inputted to the base of the transistor QI3 or QI5 is smaller than the amplitude voltage of the local signal inputted to the base of the transistor QI4 or QI6, the state between the base and the collector of the transistor QI3 or QI5 is in an OFF state, and the state between the base and the collector of the transistor QI4 or QI6 is in an ON state. In this manner, the switching operation of iRF is performed.

Filters (not shown) are provided at stages subsequent to Iout1 and Iout2, and only the desired frequency components are extracted from the frequency components included in VIout1-VIout2 and indicative of the difference and sum of the signal frequency components of iRF and the signal frequency of the local signal oscillator 10.

Local signals obtained by shifting the phase of the signal of the local signal oscillator 10 by 90 degrees at the 90-degree phase-shift circuit 20 are inputted to the bases of the transistors QQ3 to QQ6. Therefore, the transistors QQ3 to QQ6 operate as switching circuits that switch a current with the phase different by 90 degrees from the phase of the local signal oscillator 10. In this case, the current to be switched is iRF described above. By switching iRF with the phase different by 90 degrees from that of the local signal, a difference component between the collector voltage of the transistor QQ3 or QQ5 and the collector voltage of the transistor QQ4 or QQ6 (VQout1-VQout2 when a voltage of the output terminal Qout1 is taken as VQout1 and a voltage of the output terminal Qout2 is taken as VQout2) includes frequency components indicative of difference and sum of the signal frequency components of iRF and the signal frequency of the local signal oscillator 10.

As described above, since the local signal is a differential signal, the local signal inputted to the base of the transistor QQ3 or QQ5 is different in phase by 180 degrees from the local signal inputted to the base of the transistor QQ4 or QQ6. When the amplitude voltage of the local signal inputted to the base of the transistor QQ3 or QQ5 is larger than the amplitude voltage of the local signal inputted to the base of the transistor QQ4 or QQ6, the state between the base and the collector of the transistor QQ3 or QQ5 is in an ON state, and the state between the base and the collector of the transistor QQ4 or QQ6 is in an OFF state. When the amplitude voltage of the local signal inputted to the base of the transistor QQ3 or QQ5 is smaller than the amplitude voltage of the local signal inputted to the base of the transistor QQ4 or QQ6, the state between the base and the collector of the transistor QQ3 or QQ5 is in an OFF state, and the state between the base and the collector of the transistor QQ4 or QQ6 is in an ON state. In this manner, the switching operation on iRF is performed.

Filters (not shown) are provided at stages subsequent to Qout1 and Qout2, and only the desired frequency components are extracted from the frequency components included in VQout1-VQout2 and indicative of the difference and sum of the signal frequency component of iRF and the signal frequency of the local signal oscillator 10.

In a circuit portion for voltage-current conversion of the RF signal voltage to the RF signal current in the quadrature mixer circuit of FIG. 2, that is, in a portion configured of the transistors QI1, QI2, QQ1, and QQ2, the resistors RI5 and RQ5, and the current sources IEI1, IEI2, IEQ1 and IEQ2, a portion configured of the transistors QI1 and QI2, the resistor RI5, and the current sources IEI1 and IEI2 and a portion configured of the transistors QQ1 and QQ2, the resistor RQ5, and the current sources IEQ1 and IEQ2 perform the same voltage-current conversion operation. These portions performing the same operation are combined together so as to reduce current consumption.

An example of a low-current-consumption quadrature mixer circuit is shown in FIG. 3. In FIG. 3, portions performing operations similar to those of portions in FIG. 2 are provided with the same reference numerals and are not described here.

In the quadrature mixer circuit of FIG. 3, IE1 and IE2 denote current sources, and R5, RI3, RI4, RQ3, and RQ4 denote resistors. In FIG. 3, in addition to the bias conditions of FIG. 2, the following conditions are provided, that is:

the current of the current source IE1=the current of the current source IE2;

the emitter current of the transistor QI1+the emitter current of the transistor QQ1=the current of the current source IE1;

the emitter current of the transistor QI2+the emitter current of the transistor QQ2=the current of the current source IE2;

the emitter current of the transistor QI1=the emitter current of the transistor QQ1;

the emitter current of the transistor QI2=the emitter current of the transistor QQ2; and the resistance value of RI3=the resistance value of RI4=the resistance value of RQ3=the resistance value of RQ4=RC.

In the quadrature mixer circuit of FIG. 3, the RF signal voltages inputted as differential signals from the input terminals RFin1 and RFin2 are converted to RF signal currents (alternating-current components) through voltage-current conversion by the transistors QI1, QI2, QQ1, and QQ2, and the resistor R5, and the RF signal currents are branched at the resistors RI3 and RI4 and the resistors RQ3 and RQ4 and then inputted to the transistors QI3 and QI4 and the transistors QQ3 and QQ4 of the current switching units. Therefore, this quadrature mixer circuit can operate with half of the current consumption of the quadrature mixer circuit of FIG. 2 (however, the current consumption may not always become exactly half depending on adjustment of the circuit at a design stage). At this time, the resistors RI3 and RI4 and the resistors RQ3 and RQ4 are inserted in the portions which switch the current, that is, the transistors QI3 to QI6 and the transistors QQ3 to QQ6, respectively, so that the local signals inputted to the respective bases of the transistors do not interfere with one another. The resistors RI3 and RI4 and the resistors RQ3 and RQ4 are described in Japanese patent application laid-open publication No. 2004-180281 (Patent Document 1).

SUMMARY OF THE INVENTION

Incidentally, in the quadrature mixer circuit of FIG. 3, when actually manufactured, either one of the following two secondary distortion components has a deteriorated characteristic. One of the secondary distortion components is that included in desired signal components, which are outputted from an output signal voltage (VIout1-VIout2) of the I output terminals Iout1 and Iout2 (hereinafter referred to as an I output) and are extracted from the frequency components indicative of a difference and sum of signal frequency components of the current and the signal frequency of the local signal oscillator 10, the current being obtained by converting RF signal voltages inputted from the input terminals RFin1 and RFin2 as differential signals to RF signal currents (alternating-current components) through the voltage-current conversion by the transistors QI1 and QI2, the transistors QQ1 and QQ2 and the resistor R5 and then branching the currents at the resistors RI3 and RI4 and the resistors RQ3 and RQ4.

The other of the secondary distortion components is that included in desired signal components, which are outputted from an output signal voltage (QIout1-QIout2) of the Q output terminals Qout1 and Qout2 (hereinafter referred to as a Q output) and are extracted from the frequency components indicative of a difference and sum of signal frequency components of the current and the signal frequency of the local signal oscillator 10, the current being obtained by converting RF signal voltages inputted from the input terminals RFin1 and RFin2 as differential signals to RF signal currents (alternating-current components) through the voltage-current conversion by the transistors QI1 and QI2, the transistors QQ1 and QQ2 and the resistor R5 and then branching the currents at the resistors RI3 and RI4 and the resistors RQ3 and RQ4.

An example of an indicator of secondary distortion components includes a secondary input-conversion intercept point (hereinafter, referred to as IIP2).

Regarding IIP2, a quadrature mixer circuit is exemplarily described, in which the frequency components indicative of a difference between signal frequency components of the RF signal current and the signal frequency of the local signal oscillator 10, the RF signal current being obtained by converting RF signal voltages inputted from the input terminals RFin1 and RFin2 as differential signals to RF signal currents (alternating-current components) through the voltage-current conversion by the transistors QI1 and QI2, the transistors QQ1 and QQ2 and the resistor R5, are extracted from VIout1-VIout2 and VQout1-VQout2 through the filters (not shown) at the stages subsequent to Iout1 and Iout2 and Qout1 and Qout2.

First, a power gain of the quadrature mixer circuit is defined as GP [dB].

It is assumed that, when two sine waves having frequencies of Pin [dBm] different from each other by $\Delta f$ [Hz] are inputted to the quadrature mixer circuit, the level of $\Delta f$ [Hz] components appearing at the output of the quadrature mixer circuit is at S [dBm]. At this time, $$IIP2\,[dBm]=2\times Pin\,[dBm]+GP\,[dB]-S\,[dBm]$$

can be defined. Here, $\Delta f$ [Hz] is a frequency within an output desired band of the quadrature mixer circuit.

This occurs because, due to the influences of variations in amplitude values of the local signals caused by a short between the resistors RI4 and RQ4, the bias current values of the transistors QI1 and QI2 and the transistors QQ1 and QQ2 are changed.

In the quadrature mixer circuit of FIG. 3, the characteristic of either one of IIP2 of an I output and IIP2 of a Q output is deteriorated (as a matter of course, if the basic characteristic is poor, IIP2 of the I output and IIP2 of the Q output are both deteriorated).

Therefore, an object of the present invention is to provide a quadrature mixer circuit and RF communication semiconductor integrated circuit capable of solving the above-mentioned problems by suppressing the variations in secondary distortion while reducing current consumption.

The above and other objects and novel features of the present invention will be apparent from the description herein and the attached drawings.

The typical ones of the inventions disclosed in this application will be briefly described as follows.

To achieve the object described above, a transmitting device including the quadrature mixer circuit, the RF communication semiconductor integrated circuit, and others according to the present invention is configured as follows.

(1) The quadrature mixer circuit comprises: an input terminal; first and second voltage-current converter circuits having a same function to convert a signal voltage from the input terminal to a signal current; a first DC current source which supplies a bias current to the first voltage-current converter circuit; a second DC current source which supplies a bias current to the second voltage-current converter circuit; a local signal oscillator; a 90-degree phase-shift circuit which outputs a local signal of the local signal oscillator with a phase advanced or delayed by 90 degrees; a first current combiner circuit which outputs, as a first output current, a sum current of a first output current of the first voltage-current converter circuit and a second output AC current of the second voltage-current converter circuit; a second current combiner circuit which outputs, as a second output current, a sum current of a first output AC current of the first voltage-current converter circuit and a second output current of the second voltage-current converter circuit; a first current switching circuit which switches the first output current of the first current combiner circuit at a timing of the local signal of the local signal oscillator; a second current switching circuit which switches the second output current of the second current combiner circuit at a timing of the local signal which is an output from the 90-degree phase-shift circuit; a first current-voltage converter circuit which converts an output signal current of the first current switching circuit to a voltage signal; and a second current-voltage converter circuit which converts an output signal current of the second current switching circuit to a voltage signal. Therefore, IIP2 of the I output and IIP2 of the Q output can both have an excellent characteristic while reducing the current consumption.

Also, in the quadrature mixer circuit described above, an amplitude of a voltage at an output terminal of the first output current of the first current combiner circuit is different from an amplitude of a voltage at an output terminal of the second output current of the second current combiner circuit. By this means, IIP2 of the I output and IIP2 of the Q output can both have an excellent characteristic while reducing the current consumption.

Further, in the quadrature mixer circuit described above, a sum of the bias current of the first voltage-current converter circuit and the bias current of the second voltage-current converter circuit is equal to or larger than a sum of a bias current of the first current switching circuit and a bias current of the second current switching circuit. By this means, IIP2 of the I output and IIP2 of the Q output can both have an excellent characteristic while reducing the current consumption.

(2) The RF communication semiconductor integrated circuit includes a Gilbert-cell-type quadrature mixer circuit comprising: a first differential circuit which receives an RF receive signal voltage or an IF receive signal voltage converted from the RF receive signal voltage to convert it to first and second RF receive signal currents different in phase by 180 degrees or first and second IF receive signal currents different in phase by 180 degrees; a second differential circuit which receives an RF receive signal voltage or an IF receive signal voltage converted from the RF receive signal voltage to convert it to third and fourth RF receive signal currents different in phase by 180 degrees or third and fourth IF receive signal currents different in phase by 180 degrees; a local signal oscillator; a 90-degree phase-shift circuit which outputs a local signal of the local signal oscillator with a phase advanced or delayed by 90 degrees; a third differential circuit which has a first current input terminal receiving a current input, receives the local signal of the local signal oscillator to switch the current inputted to the first current input terminal at a timing of the local signal oscillator, and converts the current to first and second I output signal currents different in phase by 180 degrees; a fourth differential circuit which has a second current input terminal receiving a current input, receives the local signal of the local signal oscillator to switch the current inputted to the second current input terminal at a timing different in phase by 180 degrees from the local signal oscillator, and converts the current to third and fourth I output signal currents different in phase by 180 degrees; a fifth differential circuit which has a third current input terminal receiving a current input, receives the local signal which is the output of the 90-degree phase-shift circuit to switch the current inputted to the third current input terminal at a timing of the local signal which is the output of the 90-degree phase-shift circuit, and converts the current to first and second Q output signal currents different in phase by 180 degrees; a sixth differential circuit which has a fourth current input terminal receiving a current input, receives the local signal which is the output of the 90-degree phase-shift circuit to switch the current inputted to the fourth current input terminal at a timing different in phase by 180 degrees from the local signal which is the output of the 90-degree phase-shift circuit, and converts the current to third and fourth Q output signal currents different in phase by 180 degrees; a first I signal current adding and coupling unit which adds and couples the first I output signal current and the third I output signal current to output a fifth I signal current; a second I signal current adding and coupling unit which adds and couples the second I output signal current and the fourth I output signal current to output a sixth I signal current; a first Q signal current adding and coupling unit which adds and couples the first Q output signal current and the third Q output signal current to output a fifth Q signal current; and a second Q signal current adding and coupling unit which adds and couples the second Q output signal current and the fourth Q output signal current to output a sixth Q signal current.

In the RF communication semiconductor integrated circuit described above, the first RF receive signal current or the first IF receive signal current of the first differential circuit is coupled to the first current input terminal via a first voltage drop element, the third RF receive signal current or the third IF receive signal current of the second differential circuit is coupled to the third current input terminal via a second voltage drop element, and the first RF receive signal current or the first IF receive signal current is added and coupled to the third RF receive signal current or the third IF receive signal current by using a first capacitor, the second RF receive signal current or the second IF receive signal current of the first differential circuit is coupled to the second current input terminal via a third voltage drop element, and the fourth RF receive signal current or the fourth IF receive signal current of the second differential circuit is coupled to the fourth current input terminal via a fourth voltage drop element, and the second RF receive signal current or the second IF receive signal current is added and coupled to the fourth RF receive signal current or the fourth IF receive signal current by using a second capacitor. By this means, IIP2 of the I output and IIP2 of the Q output can both have an excellent characteristic while reducing the current consumption.

The effects obtained by typical aspects of the present invention will be briefly described below.

According to the present invention, a quadrature mixer circuit and an RF communication semiconductor integrated circuit capable of suppressing variations in secondary distortion while reducing current consumption can be provided.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings.

Figure 1:
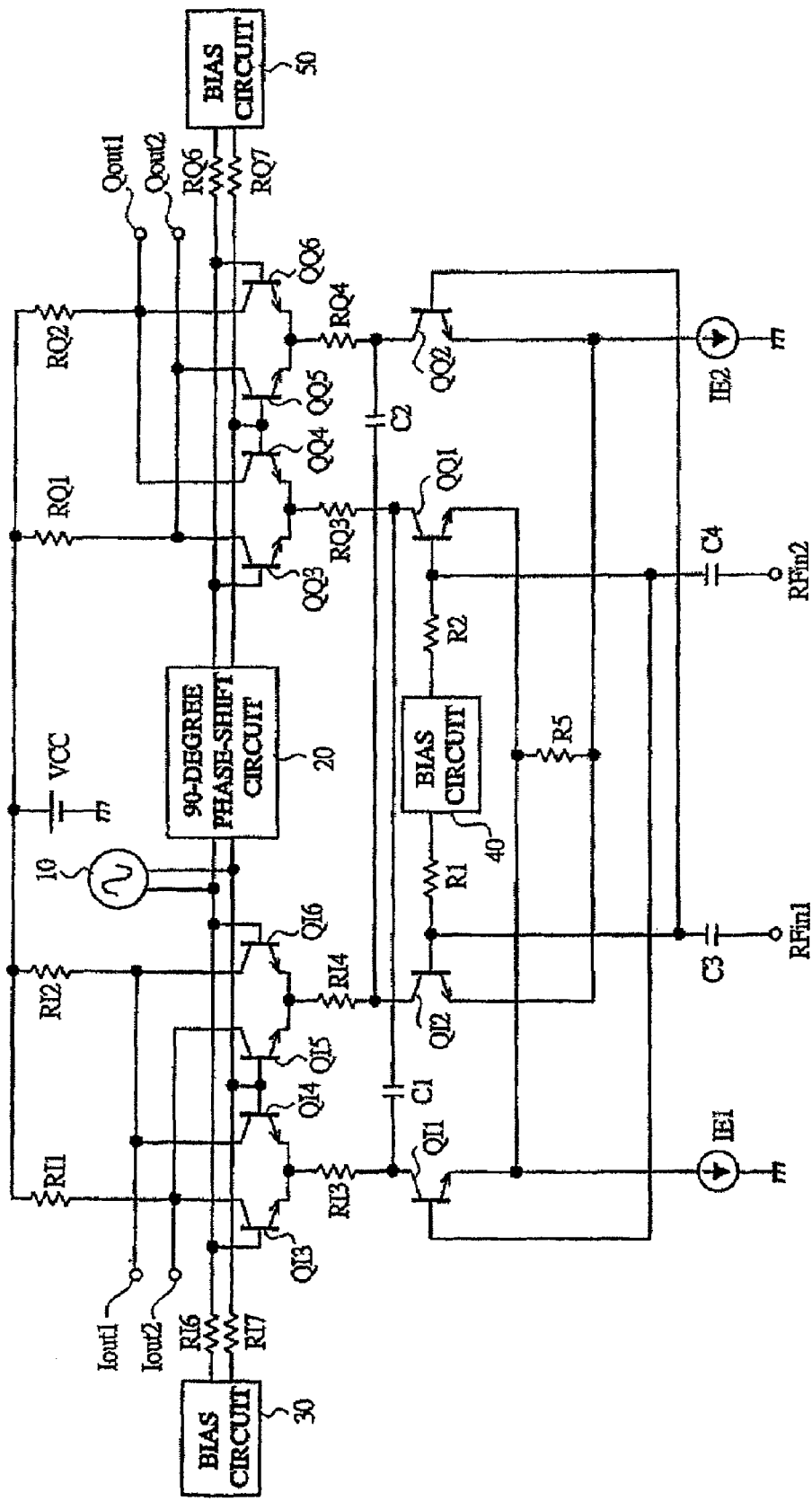
FIG. 1 is a block diagram showing one example of a quadrature mixer circuit according to one embodiment of the present invention.

FIG. 1 is a block diagram showing one example of a quadrature mixer circuit according to one embodiment of the present invention. In the quadrature mixer circuit of FIG. 1, 10 denotes a local signal oscillator; 20 denotes a 90-degree phase-shift circuit; 30 to 50 denote bias circuits; VCC denotes a battery; C1 to C4 denotes capacitors; R1, R2, R5, RI1 to RI4, RI6, RI7, RQ1 to RQ4, RQ6, and RQ7 denote resistors; QI1 to QI6 and QQ1 to QQ6 denote transistors; IE1 and IE2 denote current sources; RFin1 and RFin2 denote input terminals, Iout1 and Iout2 denote I output terminals; and Qout1 and Qout2 denote Q output terminals.

More specifically, the quadrature mixer circuit according to the present embodiment includes: first and second voltage-current converter circuits (QI1 and QI2+R5, QQ1 and QQ2+R5) having the same function to convert a signal voltage from an input terminal to a signal current; a first DC current source (IE1) that supplies a bias current to the first voltage-current converter circuit; a second DC current source (IE2) that supplies a bias current to the second voltage-current converter circuit; a local signal oscillator (10); a 90-degree phase-shift circuit (20) that outputs a local signal obtained by advancing or delaying the phase of the local signal of the local signal oscillator by 90 degrees; a first current combiner circuit (RI3 and RI4) that outputs a sum current of a first output current of the first voltage-current converter circuit and a second output AC current of the second voltage-current converter circuit as a first output current; a second current combiner circuit (RQ3 and RQ4) that outputs a sum current of a first output AC current of the first voltage-current converter circuit and a second output current of the second voltage-current converter circuit as a second output current; a first current switching circuit (QI1 to QI6) that switches the first output current of the first current combiner circuit at a timing of the local signal of the local signal oscillator; a second current switching circuit (QQ3 to QQ6) that switches the second output current of the second current combiner circuit at a timing of the local signal which is the output of the 90-degree phase-shift circuit; a first current-voltage converter circuit (RI1 and RI2) that converts an output signal current of the first current switching circuit to a voltage signal; and a second current-voltage converter circuit (RQ1 and RQ2) that converts an output signal current of the second current switching circuit to a voltage signal.

In FIG. 1, the current of the current source IE1=the current of the current source IE2;

the transistors QI1, QI2, QQ1, and QQ2 are equal to one another in size, shape, and characteristic;

the transistors QI3 to QI6 and QQ3 to QQ6 are equal to one another in size, shape, and characteristic;

the resistance value of RI1=the resistance value of RI2=the resistance value of RQ1=the resistance value of RQ2=RL;

the resistance value of RI6=the resistance value of RI7=the resistance value of RQ6=the resistance value of RQ7;

the resistance value of RI3=the resistance value of RI4=the resistance value of RQ3=the resistance value of RQ4=RC;

the resistance value of R5=RE;

the resistance value of R1=the resistance value of R2;

the capacitance value of C1=the capacitance value of C2; and the capacitance value of C3=the capacitance value of C4.

It is assumed that the bias circuits 30 to 50 provide a direct-current (DC) bias voltage to the transistors QI1 to QI6 and QQ1 to QQ6 of FIG. 1 so that the transistors QI1 to QI6 and QQ1 to QQ6 operate appropriately. That is, it is assumed that the emitter current of the transistor QI1+the emitter current of the transistor QQ1=the current of the current source IE1;

the emitter current of the transistor QI2+the emitter current of the transistor QQ2=the current of the current source IE2;

the emitter current of the transistor QI1=the emitter current of the transistor QQ1;

the emitter current of the transistor QI2=the emitter current of the transistor QQ2;

the base voltage of the transistor QI1=the base voltage of the transistor QI2=the base voltage of the transistor QQ1=the base voltage of the transistor QQ2;

the base voltage of the transistor QI3=the base voltage of the transistor QI4=the base voltage of the transistor QI5=the base voltage of the transistor QI6=the base voltage of the transistor QQ3=the base voltage of the transistor QQ4=the base voltage of the transistor QQ5=the base voltage of the transistor QQ6;

the base voltage of the transistor QI1>the emitter voltage of the transistor QI1;

the collector voltage of the transistor QI1>the emitter voltage of the transistor QI1;

the base voltage of the transistor QI2>the emitter voltage of the transistor QI2;

the collector voltage of the transistor QI2>the emitter voltage of the transistor QI2;

the collector voltages of the transistors QI3 and QI5>the emitter voltages of the transistors QI3 and QI5;

the collector voltages of the transistors QI4 and QI6>the emitter voltages of the transistors QI4 and QI6;

the base voltage of the transistor QQ1>the emitter voltage of the transistor QQ1;

the collector voltage of the transistor QQ1>the emitter voltage of the transistor QQ1;

the base voltage of the transistor QQ2>the emitter voltage of the transistors QQ2;

the collector voltage of the transistor QQ2>the emitter voltage of the transistor QQ2;

the collector voltages of the transistors QQ3 and QQ5>the emitter voltages of the transistors QQ3 and QQ5; and the collector voltages of the transistors QQ4 and QQ6>the emitter voltages of the transistors QQ4 and QQ6.

The operation of the quadrature mixer circuit in FIG. 1 is described.

Direct-current components of an RF signal inputted as a differential signal from the input terminal RFin1 are cut by the capacitor C3, and the RF signal is then branched and inputted to the bases of the transistors QI2 and QQ2. Also, direct-current components of an RF signal inputted as a differential signal from the input terminal RFin2 are cut by the capacitor C4, and the RF signal is then branched and inputted to the bases of the transistors QI1 and QQ1. The current sources IEI1 and IEI2 supply a bias current to the transistors QI1 and QI2 and the transistors QQ1 and QQ2. As described above, since the transistors QI1, QI2, QQ1, and QQ2 are identical to one another in size, shape, and characteristic, the emitter current of the transistor QI1+the emitter current of the transistor QQ1=the current of the current source IE1;

the emitter current of the transistor QI2+the emitter current of the transistor QQ2=the current of the current source IE2;

the emitter current of the transistor QI1=the emitter current of the transistor QQ1; and the emitter current of the transistor QI2=the emitter current of the transistor QQ2.

The RF signal voltages inputted as differential signals from the input terminals RFin1 and RFin2 are converted to the RF signal currents through the voltage-current conversion by the transistors QI1, QI2, QQ1 and QQ2 and the resistor R5.

When an RF signal voltage (alternating-current component) inputted as a differential signal from the input terminals RFin1 and RFin2 is taken as vRF and an RF signal current after voltage-current conversion (alternating-current component) is taken as iRF, iRFi =the RF signal current of the collector current of the transistor QI1 (alternating-current component)-the RF signal current of the collector current of the transistor QI2 (alternating-current component); and iRFq =the RF signal current of the collector current of the transistor QQ1 (alternating-current component)-the RF signal current of the collector current of the transistor QQ2 (alternating-current component), wherein iRFi+iRFq=vRF/RE.

Figure 2:
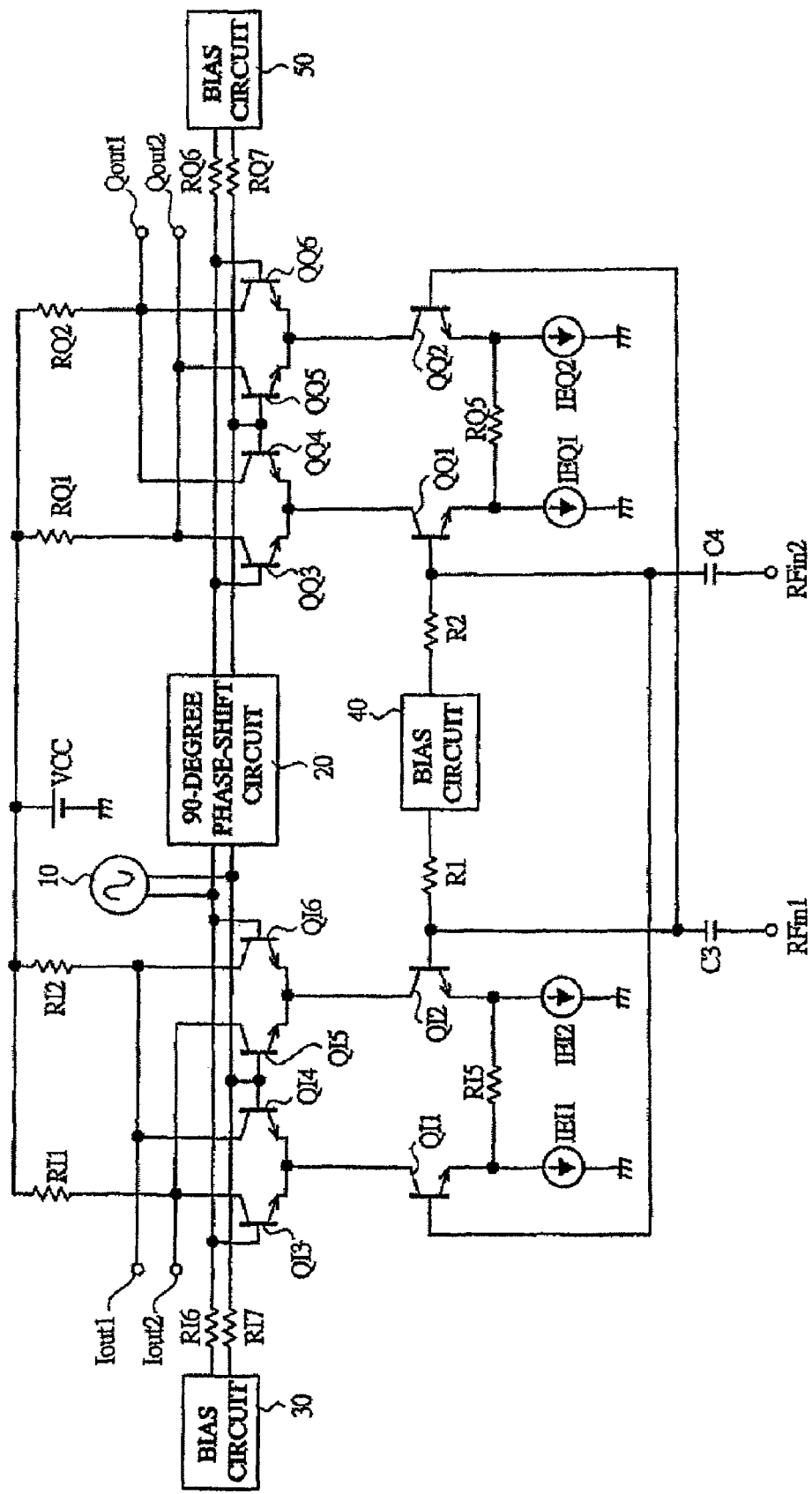
FIG. 2 is a block diagram showing one example of a quadrature mixer circuit according to a first conventional example.
Figure 3:
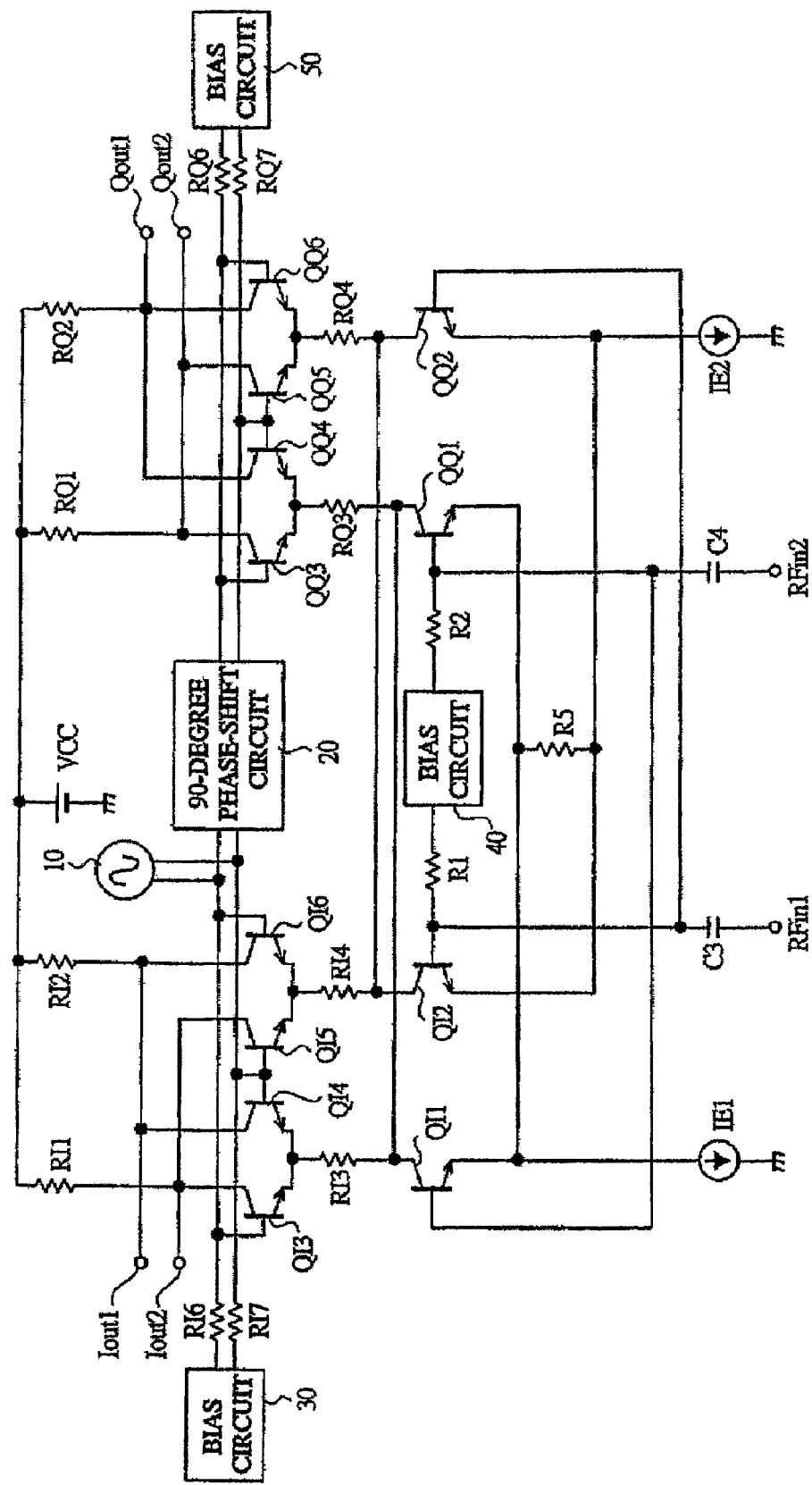
FIG. 3 is a block diagram showing one example of a quadrature mixer circuit according to a second conventional example.

Similar to that in FIG. 3, in the quadrature mixer circuit of FIG. 1, iRFi obtained by converting the RF signal voltages inputted as differential signals from the input terminals RFin1 and RFin2 to RF signal currents through the voltage-current conversion by the transistors QI1 and QI2 and the resistor R5 and iRFq obtained by converting the RF signal voltages inputted as differential signals from the input terminals RFin1 and RFin2 to RF signal currents through the voltage-current conversion by the transistors QQ1 and QQ2 and the resistor R5 are added together at the capacitors C1 and C2 in an alternating-current manner. The resultant current is branched at the resistors RI3 and RI4 and the resistors RQ3 and RQ4 and then inputted to the transistors QI3 and QI4 and the transistors QQ3 and QQ4 at the current switching units. Therefore, the quadrature mixer circuit according to this embodiment can operate with half of the current consumption of the quadrature mixer circuit of FIG. 2 (however, the current consumption may not always become exactly half depending on adjustment of the circuit at a design stage). The resistors RI3 and RI4 and the resistors RQ3 and RQ4 are inserted in portions that switch the current, that is, the transistors QI3 to QI6 and the transistors QQ3 to QQ6, respectively, so that the local signals inputted to the respective bases of the transistors do not interfere with one another. The resistors RI3 and RI4 and the resistors RQ3 and RQ4 are described in the Patent Document 1. In addition to the resistors RI3 and RI4 and the resistors RQ3 and RQ4 described in the Patent Document 1, the capacitor C1 is inserted between the resistors RI3 and RQ3 and the capacitor C2 is inserted between the resistors RI4 and RQ4 in the configuration of FIG. 1.

Here, it is assumed that:

a signal frequency component of a current flowing from the resistors RI3 and RI4 into the transistors QI3 to QI6 is taken as iRFI, and a signal frequency component of a current flowing from the resistors RQ3 and RQ4 into the transistors QQ3 to QQ6 is taken as iRFQ. As a matter of course, if variations in elements are not present, iRFI=iRFQ.

Local signals outputted from the local signal oscillator 10 are inputted to the bases of the transistors QI3 to QI6. Therefore, the transistors QI3 to QI6 operate as switching circuits that switch a current with the same phase as that of the local signal oscillator 10. In this case, the current to be switched is iRFI described above. By switching iRFI with the same phase as that of the local signal, a difference component between the collector voltage of the transistor QI3 or QI5 and the collector voltage of the transistor QI4 or QI6 (VIout1-VIout2 when a voltage of the output terminal Iout1 is taken as VIout1 and a voltage of the output terminal Iout2 is taken as VIout2) includes frequency components indicative of difference and sum of the signal frequency components of iRFI and the signal frequency of the local signal oscillator 10.

The local signal is a differential signal. That is, the local signal inputted to the base of the transistor QI3 or QI5 is different in phase by 180 degrees from the local signal inputted to the base of the transistor QI4 or QI6. When the amplitude voltage of the local signal inputted to the base of the transistor QI3 or QI5 is larger than the amplitude voltage of the local signal inputted to the base of the transistor QI4 or QI6, the state between the base and the collector of the transistor QI3 or QI5 is in an ON state, and the state between the base and the collector of the transistor QI4 or QI6 is in an OFF state. When the amplitude voltage of the local signal inputted to the base of the transistor QI3 or QI5 is smaller than the amplitude voltage of the local signal inputted to the base of the transistor QI4 or QI6, the state between the base and the collector of the transistor QI3 or QI5 is in an OFF state, and the state between the base and the collector of the transistor QI4 or QI6 is in an ON state. In this manner, the switching operation on iRFI is performed.

Filters (not shown) are provided at stages subsequent to Iout1 and Iout2, and only the desired frequency components are extracted from the frequency components included in VIout1-VIout2 and indicative of the difference and sum of the signal frequency components of iRFI and the signal frequency of the local signal oscillator 10.

Local signals obtained by shifting the phase of the signal of the local signal oscillator 10 by 90 degrees at the 90-degree phase-shift circuit 20 are inputted to the bases of the transistors QQ3 to QQ6. Therefore, the transistors QQ3 to QQ6 operate as switching circuits that switch a current with the phase different by 90 degrees from the phase of the local signal oscillator 10. In this case, the current to be switched is iRFQ described above. By switching iRFQ with the phase different by 90 degrees from that of the local signal, a difference component between the collector voltage of the transistor QQ3 or QQ5 and the collector voltage of the transistor QQ4 or QQ6 (VQout1-VQout2 when a voltage of the output terminal Qout1 is taken as VQout1 and a voltage of the output terminal Qout2 is taken as VQout2) includes frequency components indicative of difference and sum of the signal frequency components of iRFQ and the signal frequency of the local signal oscillator 10.

As described above, since the local signal is a differential signal, the local signal inputted to the base of the transistor QQ3 or QQ5 is different in phase by 180 degrees from the local signal inputted to the base of the transistor QQ4 or QQ6. When the amplitude voltage of the local signal inputted to the base of the transistor QQ3 or QQ5 is larger than the amplitude voltage of the local signal inputted to the base of the transistor QQ4 or QQ6, the state between the base and the collector of the transistor QQ3 or QQ5 is in an ON state, and the state between the base and the collector of the transistor QQ4 or QQ6 is in an OFF state. When the amplitude voltage of the local signal inputted to the base of the transistor QQ3 or QQ5 is smaller than the amplitude voltage of the local signal inputted to the base of the transistor QQ4 or QQ6, the state between the base and the collector of the transistor QQ3 or QQ5 is in an OFF state, and the state between the base and the collector of the transistor QQ4 or QQ6 is in an ON state. In this manner, the switching operation on iRFQ is performed.

Filters (not shown) are provided at stages subsequent to Qout1 and Qout2, and only the desired frequency components are extracted from the frequency components included in VQout1-VQout2 and indicative of the difference and sum of the signal frequency component of iRFQ and the signal frequency of the local signal oscillator 10.

As described in "Summary of the Invention", in the quadrature mixer circuit of Patent Document 1, that is, in the quadrature mixer circuit of FIG. 3, when actually manufactured, either one of the following two secondary distortion components has a deteriorated characteristic. One of the secondary distortion components is that included in desired signal components, which are outputted from an output signal voltage (VIout1-VIout2) of the I output terminals Iout1 and Iout2 (hereinafter referred to as an I output) and are extracted from the frequency components indicative of a difference and sum of signal frequency components of the current and the signal frequency of the local signal oscillator 10, the current being obtained by converting RF signal voltages inputted from the input terminals RFin1 and RFin2 as differential signals to RF signal currents (alternating-current components) through the voltage-current conversion by the transistors QI1 and QI2, the transistors QQ1 and QQ2 and the resistor R5 and then branching the currents at the resistors RI3 and RI4 and the resistors RQ3 and RQ4. The other of the secondary distortion components is that included in desired signal components, which are outputted from an output signal voltage (QIout1-QIout2) of the Q output terminals Qout1 and Qout2 (hereinafter referred to as a Q output) and are extracted from the frequency components indicative of a difference and sum of signal frequency components of the current and the signal frequency of the local signal oscillator 10, the current being obtained by converting RF signal voltages inputted from the input terminals RFin1 and RFin2 as differential signals to RF signal currents (alternating-current components) through the voltage-current conversion by the transistors QI1 and QI2, the transistors QQ1 and QQ2 and the resistor R5 and then branching the currents at the resistors RI3 and RI4 and the resistors RQ3 and RQ4.

An example of an indicator of secondary distortion components includes a secondary input-conversion intercept point (hereinafter, referred to as IIP2).

Regarding IIP2, a quadrature mixer circuit is exemplarily described, in which the frequency components indicative of a difference between signal frequency components of the RF signal current and the signal frequency of the local signal oscillator 10, the RF signal current being obtained by converting RF signal voltages inputted from the input terminals RFin1 and RFin2 as differential signals to RF signal currents (alternating-current components) through the voltage-current conversion by the transistors QI1 and QI2, the transistors QQ1 and QQ2 and the resistor R5, are extracted from VIout1-VIout2 and VQout1-VQout2 through the filters (not shown) at the stages subsequent to Iout1 and Iout2 and Qout1 and Qout2.

First, a power gain of the quadrature mixer circuit is defined as GP [dB].

It is assumed that, when two sine waves having frequencies of Pin [dBm] different from each other by $\Delta f$ [Hz] are inputted to the quadrature mixer circuit, the level of $\Delta f$ [Hz] components appearing at the output of the quadrature mixer circuit is at S [dBm]. At this time, $$IIP2\ [dBm] = 2 \times Pin\ [dBm] + GP\ [dB] - S\ [dBm]$$

can be defined. Here, $\Delta f$ [Hz] is a frequency within an output desired band of the quadrature mixer circuit.

That is, in the quadrature mixer circuit of FIG. 3, the characteristic of either one of IIP2 of an I output and IIP2 of a Q output is deteriorated (as a matter of course, if the basic characteristic is poor, IIP2 of the I output and IIP2 of the Q output are both deteriorated).

This occurs because, due to the influences of variations in amplitude values of the local signals caused by a short between the resistors RI4 and RQ4, the bias current values of the transistors QI1 and QI2 and the transistors QQ1 and QQ2 are changed. However, since the capacitors C1 and C2 are inserted in the quadrature mixer circuit of FIG. 1, interference of the local signals occurs only in alternating-current components, and the direct-current components are not influenced.

That is, since the capacitors C1 and C2 are inserted, changes in bias current values of the transistors QI1 and QI2 and the transistors QQ1 and QQ2 can be suppressed. Accordingly, even when actually manufactured, both of the following two secondary distortion components can achieve an excellent characteristic. One of the secondary distortion components is that included in desired signal components, which are outputted from an output signal voltage (VIout1-VIout2) of the I output terminals Iout1 and Iout2 and are extracted from the frequency components indicative of a difference and sum of signal frequency components iRFI and the signal frequency of the local signal oscillator 10, when iRFI is set as the signal frequency components of the current obtained by adding, at the capacitors C1 and C2, iRFi obtained by converting RF signal voltages inputted from the input terminals RFin1 and RFin2 as differential signals to RF signal currents through the voltage-current conversion by the transistors QI1 and QI2 and the resistor R5 and iRFq obtained by converting RF signal voltages inputted from the input terminals RFin1 and RFin2 as differential signals to RF signal currents through the voltage-current conversion by the transistors QQ1 and QQ2 and the resistor R5, and then branching the resultant currents at the resistors RI3 and RI4 and the resistors RQ3 and RQ4 to be flown from the resistors RI3 and RI4 to the transistors QI3 to QI6. The other of the secondary distortion components is that included in desired signal components, which are outputted from an output signal voltage (QIout1-QIout2) of the Q output terminals Qout1 and Qout2 and are extracted from the frequency components indicative of a difference and sum of signal frequency components iRFQ and the signal frequency of the local signal oscillator 10, when iRFQ is set as the signal frequency components of the current obtained by adding, at the capacitors C1 and C2, iRFi obtained by converting RF signal voltages inputted from the input terminals RFin1 and RFin2 as differential signals to RF signal currents through the voltage-current conversion by the transistors QI1 and QI2 and the resistor R5 and iRFq obtained by converting RF signal voltages inputted from the input terminals RFin1 and RFin2 as differential signals to RF signal currents through the voltage-current conversion by the transistors QQ1 and QQ2 and the resistor R5, and then branching the resultant currents at the resistors RI3 and RI4 and the resistors RQ3 and RQ4 to be flown from the resistors RQ3 and RQ4 to the transistors QQ3 to QQ6.

That is, in the quadrature mixer circuit of FIG. 1, IIP2 of the I output and IIP2 of the Q output can both have an excellent characteristic.

Prototypes of the quadrature circuits of FIG. 1 and FIG. 3 are actually manufactured as WCMDA zero-IF receiver circuits. The prototyped quadrature mixer circuit has a low-noise amplifier inserted at a preceding stage. Two sine waves of −33 dBm, one having a frequency of 1950.95 MHz and the other having a frequency of 1951.05 MHz, are inputted to this low-noise amplifier, and then IIP2 described above is measured. In this case, the oscillation frequency of the local signal oscillator 10 of FIG. 1 and FIG. 3 is 2140 MHz, and Δf is 1 MHz. As a result, in the quadrature mixer circuit of FIG. 3, IIP2 of the I output=30.1 dBm; and
IIP2 of the Q output=45.1 dBm.

On the other hand, in the quadrature mixer circuit of FIG. 1,
IIP2 of the I output=51.4 dBm; and
IIP2 of the Q output=46.5 dBm.

As such, it has been confirmed that IIP2 of the I output and the IIP2 of the Q output both have an excellent characteristic.

A prototype of only the quadrature mixer circuit of FIG. 1 is also manufactured. This is also a prototype of a WCMDA zero-IF receiver circuit. Similarly, two sine waves of −33 dBm, one having a frequency of 1950.95 MHz and the other having a frequency of 1951.05 MHz, are inputted to this quadrature mixer circuit, and then IIP2 described above is measured. In this case, similarly to the above, the oscillation frequency of the local signal oscillator 10 of FIG. 1 is 2140 MHz, and Δf is 1 MHz. As a result, IIP2 of the I output=65.7 dBm, and
IIP2 of the Q output=52.8 dBm.

It has been confirmed that, since a low-noise amplifier is not provided at a preceding stage, more excellent results can be achieved, and also both of IIP2 of the I output and the IIP2 of the Q output have an excellent characteristic.

As described above, in the quadrature mixer circuit according to the present embodiment, IIP2 of the I output and IIP2 of the Q output can both have an excellent characteristic while reducing the current consumption. That is, as for the local signals different form each other by 90 degrees to be inputted to the bases of the transistors QI3 to QI6 and the bases of the transistors QQ3 to QQ6, respectively, even when the amplitudes of the local signals are large, interference is suppressed by the resistors RI3 and RI4, the resistors RQ3 and RQ4, and the capacitors C1 and C2. Also, since the capacitors C1 and C2 are provided, changes in direct-current bias do not occur. Therefore, variations in secondary distortion can be suppressed. Furthermore, since the capacitors C1 and C2 combine a current output of a differential circuit formed of the transistors QI1 and QI2 and the resistor R5 and a current output of a differential circuit formed of the transistors QQ1 and QQ2 and the resistor R5 together, it is possible to reduce the current consumption. As a result, variations in secondary distortion can be suppressed while reducing the current consumption.

In the foregoing, the invention made by the inventors of the present invention has been concretely described based on the embodiments. However, it is needless to say that the present invention is not limited to the foregoing embodiments and various modifications and alterations can be made within the scope of the present invention.

Although a quadrature mixer circuit is exemplarily described in the embodiment above, the present invention can also be configured as an RF communication semiconductor integrated circuit.

That is, the RF communication semiconductor integrated circuit includes a Gilbert-cell-type quadrature mixer circuit comprising: a first differential circuit (QI1, QI2 and R5) that receives an RF receive signal voltage or an IF receive signal voltage converted from the RF receive signal voltage to convert it to first and second RF receive signal currents different in phase by 180 degrees or first and second IF receive signal currents different in phase by 180 degrees; a second differential circuit (QQ1, QQ2 and R5) that receives an RF receive signal voltage or an IF receive signal voltage converted from the RF receive signal voltage to convert it to third and fourth RF receive signal currents different in phase by 180 degrees or third and fourth IF receive signal currents different in phase by 180 degrees; a local signal oscillator (10); a 90-degree phase-shift circuit (20) that outputs a local signal of the local signal oscillator with a phase advanced or delayed by 90 degrees; a third differential circuit (QI3 and QI4) that has a first current input terminal receiving a current input, receives the local signal of the local signal oscillator to switch the current inputted to the first current input terminal at a timing of the local signal oscillator, and converts the current to first and second I output signal currents different in phase by 180 degrees; a fourth differential circuit (QI5 and QI6) that has a second current input terminal receiving a current input, receives the local signal of the local signal oscillator to switch the current inputted to the second current input terminal at a timing different in phase by 180 degrees from the local signal oscillator, and converts the current to third and fourth I output signal currents different in phase by 180 degrees; a fifth differential circuit (QQ3 and QQ4) that has a third current input terminal receiving a current input, receives the local signal which is the output of the 90-degree phase-shift circuit to switch the current inputted to the third current input terminal at a timing of the local signal which is the output of the 90-degree phase-shift circuit, and converts the current to first and second Q output signal currents different in phase by 180 degrees; a sixth differential circuit (QQ5 and QQ6) that has a fourth current input terminal receiving a current input, receives the local signal which is the output of the 90-degree phase-shift circuit to switch the current inputted to the fourth current input terminal at a timing different in phase by 180 degrees from the local signal which is the output of the 90-degree phase-shift circuit, and converts the current to third and fourth Q output signal currents different in phase by 180 degrees; a first I signal current adding and coupling unit (RI1) that adds and couples the first I output signal current and the third I output signal current to output a fifth I signal current; a second I signal current adding and coupling unit (RI2) that adds and couples the second I output signal current and the fourth I output signal current to output a sixth I signal current; a first Q signal current adding and coupling unit (RQ1) that adds and couples the first Q output signal current and the third Q output signal current to output a fifth Q signal current; and a second Q signal current adding and coupling unit (RQ2) that adds and couples the second Q output signal current and the fourth Q output signal current to output a sixth Q signal current.

In the above-described RF communication semiconductor integrated circuit, the first RF receive signal current or the first IF receive signal current of the first differential circuit is coupled to the first current input terminal via a first voltage drop element (RI3). The third RF receive signal current or the third IF receive signal current of the second differential circuit is coupled to the third current input terminal via a second voltage drop element (RI4), and the first RF receive signal current or the first IF receive signal current is added and coupled to the third RF receive signal current or the third IF receive signal current by using a first capacitor (C1). The second RF receive signal current or the second IF receive signal current of the first differential circuit is coupled to the second current input terminal via a third voltage drop element (RQ3). The fourth RF receive signal current or the fourth IF receive signal current of the second differential circuit is coupled to the fourth current input terminal via a fourth voltage drop element (RQ4), and the second RF receive signal current or the second IF receive signal current is added and coupled to the fourth RF receive signal current or the fourth IF receive signal current by using a second capacitor (C2).

Also in this RF communication semiconductor integrated circuit, similar to the above, IIP2 of the I output and IIP2 of the Q output can both have an excellent characteristic while reducing the current consumption. As a result, variations in secondary distortion of the RF communication semiconductor integrated circuit can be suppressed while suppressing the current consumption.

Furthermore, the transistors of the quadrature mixer circuit may be configured of MOSes (Metal Oxide Semiconductors). In this case, approximately the same operations can be performed even with a difference in characteristic.

The present invention can be effectively applied to the quadrature mixer circuit and RF communication semiconductor integrated circuit in which the signals are frequency-converted by using two local signals that are equal in frequency and different in phase by 90 degrees.

What is claimed is:

1. An RF communication semiconductor integrated circuit which includes a Gilbert-cell-type quadrature mixer circuit comprising:

a first differential circuit which receives an RF receive signal voltage or an IF receive signal voltage converted from the RF receive signal voltage to convert it to first and second RF receive signal currents different in phase by 180 degrees or first and second IF receive signal currents different in phase by 180 degrees;

a second differential circuit which receives an RF receive signal voltage or an IF receive signal voltage converted from the RF receive signal voltage to convert it to third and fourth RE receive signal currents different in phase by 180 degrees or third and fourth IF receive signal currents different in phase by 180 degrees;

a local signal oscillator;

a 90-degree phase-shift circuit which outputs a local signal of said local signal oscillator with a phase advanced or delayed by 90 degrees;

a third differential circuit which has a first current input terminal receiving a current input, receives the local signal of said local signal oscillator to switch the current inputted to said first current input terminal at a timing of said local signal oscillator, and converts the current to first and second I output signal currents different in phase by 180 degrees;

a fourth differential circuit which has a second current input terminal receiving a current input, receives the local signal of said local signal oscillator to switch the current inputted to said second current input terminal at a timing different in phase by 180 degrees from said local signal oscillator, and converts the current to third and fourth I output signal currents different in phase by 180 degrees;

a fifth differential circuit which has a third current input terminal receiving a current input, receives the local signal which is the output of said 90-degree phase-shift circuit to switch the current inputted to said third current input terminal at a timing of the local signal which is the output of said 90-degree phase-shift circuit, and converts the current to first and second Q output signal currents different in phase by 180 degrees;

a sixth differential circuit which has a fourth current input terminal receiving a current input, receives the local signal which is the output of said 90-degree phase-shift circuit to switch the current inputted to said fourth current input terminal at a timing different in phase by 180 degrees from the local signal which is the output of said 90-degree phase-shift circuit, and converts the current to third and fourth Q output signal currents different in phase by 180 degrees;

a first I signal current adding and coupling unit which adds and couples said first I output signal current and said third I output signal current to output a fifth I signal current;

a second I signal current adding and coupling unit which adds and couples said second I output signal current and said fourth I output signal current to output a sixth I signal current;

a first Q signal current adding and coupling unit which adds and couples said first Q output signal current and said third Q output signal current to output a fifth Q signal current; and a second Q signal current adding and coupling unit which adds and couples said second Q output signal current and said fourth Q output signal current to output a sixth Q signal current, wherein the first RF receive signal current or the first IF receive signal current of said first differential circuit is coupled to said first current input terminal via a first voltage drop element, the third RF receive signal current or the third IF receive signal current of said second differential circuit is coupled to said third current input terminal via a second voltage drop element, and the first RF receive signal current or the first IF receive signal current is added and coupled to the third RF receive signal current or the third IF receive signal current through the first voltage drop element and a first capacitor, the second RF receive signal current or the second IF receive signal current of said first differential circuit is coupled to said second current input terminal via a third voltage drop element, and the fourth RF receive signal current or the fourth IF receive signal current of said second differential circuit is coupled to said fourth current input terminal via a fourth voltage drop element, and the second RF receive signal current or the second IF receive signal current is added and coupled to the fourth RF receive signal current or the fourth IF receive signal current through the third voltage drop element and a second capacitor.

* * * * *